United States Patent
Lintonen et al.

(10) Patent No.: US 10,678,288 B2
(45) Date of Patent: *Jun. 9, 2020

(54) METHOD AND APPARATUS TO MINIMIZE SWITCHING NOISE DISTURBANCE

(71) Applicant: Telefonaktiebolaget LM Ericsson (publ), Stockholm (SE)

(72) Inventors: Mikko Lintonen, Oulu (FI); Marko Pessa, Oulu (FI)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 16/556,876

(22) Filed: Aug. 30, 2019

(65) Prior Publication Data

US 2019/0384341 A1    Dec. 19, 2019

Related U.S. Application Data

(63) Continuation of application No. 15/904,710, filed on Feb. 26, 2018, now Pat. No. 10,429,875, which is a (Continued)

(51) Int. Cl.
*G05F 3/26* (2006.01)
*G05F 1/46* (2006.01)
(Continued)

(52) U.S. Cl.
CPC ............... *G05F 3/26* (2013.01); *G05F 1/468* (2013.01); *G05F 1/56* (2013.01); *H03K 17/163* (2013.01)

(58) Field of Classification Search
CPC ... H02M 2001/0022; H02M 2001/008; H02M 1/08; H02M 3/158; G05F 1/468;
(Continued)

(56) References Cited

U.S. PATENT DOCUMENTS 4,001,731 A    1/1977    Van Sluys
4,544,878 A    10/1985    Beale et al.
(Continued)

FOREIGN PATENT DOCUMENTS

JP    S6124325 A    2/1986
RU    124452 U1    1/2013

OTHER PUBLICATIONS

Chiou, D-S., et al., "Timing Driven Power Gating", 43rd ACM/IEEE Design Automation Conference, Jul. 24, 2006, pp. 121-124, IEEE.

*Primary Examiner* — Nguyen Tran
*Assistant Examiner* — David A. Singh
(74) *Attorney, Agent, or Firm* — Coats & Bennett, PLLC

(57) ABSTRACT

A power management circuit generates a reference voltage and distributes it to a plurality of independently-enabled regulator voltage reference circuits, each of which generates a predetermined voltage for a voltage regulator. Separate enable signals and enable pre-charge signals are distributed to each regulator voltage reference circuit. As a regulator voltage reference circuit is enabled via its associated enable signal, an enable pre-charge signal is also asserted for an initial duration. Each regulator voltage reference circuit includes a voltage setting circuit and a first current limiting transistor in series and operative to interrupt current to the voltage setting circuit when the regulator voltage reference circuit is disabled. A second current limiting transistor is configurably configured as a current mirror with the first current limiting transistor, and a pre-charge bias current from a current source passes through the second transistor. This limits the current through the first transistor and into the voltage setting circuit for the initial duration. After the initial duration, the current mirror is disabled and the first transistor is rendered fully conductive.

21 Claims, 10 Drawing Sheets

Related U.S. Application Data continuation of application No. 15/308,449, filed as application No. PCT/EP2015/060636 on May 13, 2015, now Pat. No. 9,904,309, which is a continuation of application No. 14/280,963, filed on May 19, 2014, now Pat. No. 9,405,308.

(51) Int. Cl.
*G05F 1/56* (2006.01)
*H03K 17/16* (2006.01)

(58) Field of Classification Search
CPC ............ G05F 1/56; G05F 1/562; G05F 3/242; G05F 3/26; G05F 7/00
See application file for complete search history.

(56) References Cited

U.S. PATENT DOCUMENTS

| | | |
|---|---|---|
| 4,994,730 A | 2/1991 | Rossi et al. |
| 5,514,989 A | 5/1996 | Sato et al. |
| 5,598,094 A | 1/1997 | Kiehl et al. |
| 5,612,614 A | 3/1997 | Barrett, Jr. et al. |
| 5,796,767 A | 8/1998 | Aizawa |
| 5,867,012 A | 2/1999 | Tuthill |
| 6,107,789 A | 8/2000 | Fryer et al. |
| 6,194,957 B1 | 2/2001 | Fryer et al. |
| 6,404,275 B1 | 6/2002 | Voldman et al. |
| 6,842,053 B1 | 1/2005 | Luo |
| 6,998,904 B2 | 2/2006 | Marshall et al. |
| 7,230,410 B1 | 6/2007 | Jordan |
| 7,710,190 B2 | 5/2010 | Oberhuber |
| 8,519,694 B2 | 8/2013 | Berkhout |
| 9,046,551 B2 | 6/2015 | Ok |
| 2007/0164809 A1 | 7/2007 | Fukuda et al. |
| 2009/0189684 A1 | 7/2009 | Gouin |
| 2012/0049921 A1 | 3/2012 | Chang et al. |
| 2012/0112718 A1 | 5/2012 | Pons |
| 2013/0221942 A1 | 8/2013 | Hu et al. |
| 2013/0271095 A1 | 10/2013 | Jackum et al. |
| 2015/0035591 A1 | 2/2015 | Nicollini et al. |
| 2015/0054477 A1 | 2/2015 | Nascimento |

METHOD AND APPARATUS TO MINIMIZE SWITCHING NOISE DISTURBANCE

CROSS REFERENCE TO RELATED APPLICATIONS

This application is a continuation of U.S. patent application Ser. No. 15/904,710, filed Feb. 26, 2018, which is a continuation of U.S. patent application Ser. No. 15/308,449, filed Nov. 2, 2016, which issued as U.S. Pat. No. 9,904,309 on Feb. 27, 2018, which is the National Stage of International App. No. PCT/EP2015/060636, filed May 13, 2015, which is a continuation of U.S. patent application Ser. No. 14/280,963, filed May 19, 2014, which issued as U.S. Pat. No. 9,405,308 on Aug. 2, 2016, all of which are hereby incorporated by reference in their entireties.

FIELD OF INVENTION

The present invention relates generally to power management circuits, and in particular to a method and apparatus to minimize switching noise when enabling a disabled reference voltage generated for a voltage regulator.

BACKGROUND

Modern electronic devices often include a variety of electrical and electronic circuits. For example, a computing device such as a smartphone or tablet may include one or more processor or Digital Signal Processor (DSP) circuits with associated memory; one or more Radio Frequency (RF) modem circuits for radio connectivity; a display driver circuit; and various signal processing circuits, such as a satellite positioning receiver, audio or video processing circuits; and the like. These disparate circuits often have different power supply requirements, such as different required DC voltage levels.

Many modern electronic devices are portable, and are powered by batteries—either replaceable batteries such as alkaline cells, or rechargeable batteries such as NiCd, NiMH, LiOn, or the like. In either case, the useful life of portable electronic devices is limited by available battery power, which decreases in proportion to the length of use of the device, and the level of power consumption during that use. With each generation of most electronic devices, form factors shrink, due to increasing integration of electronics and miniaturization of component parts, such as disk drives, while simultaneously new features and functionality are added, increasing the component count and/or computational load. Both trends exacerbate the problem of limited available power. Shrinking devices force the size of the battery to shrink as well, which generally reduces the available energy storage capacity, while at the same time the battery must power more components, or drive processors at higher speeds. These factors have made power management a critical area of optimization for electronic device designers.

One known adaptive power management approach is to identify circuits (or sub-circuits) that are not used for extended periods, and put them into a low-activity state, also referred to as a "sleep mode," even if other circuits in the device are fully active. As one example, the illuminated display screen of many devices will shut off after a (selectable) duration of no user interactivity. A straightforward way to shut down a particular electronic circuit is to interrupt the power supplied to that circuit. Since the remainder of the device is still active, a plurality of individually-enabled power supply circuits is required.

FIG. 1 depicts a portion of one known power management system 10. A main voltage reference circuit 12 generates and maintains a precise reference voltage. The main reference voltage is distributed to a plurality of regulator voltage reference circuits 14A, 14B, 14C. Each of the regulator voltage reference circuits 14A-C generates a reference voltage for a downstream voltage regulator (not shown), by dividing the main reference voltage by a factor of K, where K=[1, infinite]. For example, the regulator voltage reference circuit 14A may output 12 VDC and its associated voltage regulator drives analog RF circuits; regulator voltage reference circuit 14B may output 5 VDC and its associated voltage regulator drives discrete digital logic; and regulator voltage reference circuit 14C may output 3.3 VDC and its associated voltage regulator drives a microprocessor and memory. Each regulator voltage reference circuit 14A-C is independently enabled by a control circuit (not shown) via separate enable signals. The associated voltage regulators may be enabled/disabled by the same enable signals as their regulator voltage reference circuits 14A-C.

FIG. 2 depicts a common configuration for a representative regulator voltage reference circuit 14N. Each regulator voltage reference circuit 14N includes, for example, a voltage setting circuit, which may be a resistive voltage divider network comprising resistors 16, 18, operative to reduce the reference voltage by a predetermined factor. Selective enabling of the regulator reference voltage output is provided by interposing a switch 20, such as a MOSFET transistor, in series with the voltage setting circuit 16, 18. The switch 20 is controlled by the enable_N signal, possibly through a buffer 22 to provide drive strength and conform the signal assertion level to the particular type of transistor used. When the regulator voltage reference circuit 14N is disabled, the switch 20 interrupts current flow to the voltage setting resistors 16, 18, reducing the output voltage to zero. The system may later enable the regulator voltage reference circuit 14N by turning the switch 20 ON, or rendering it fully conductive, via the enable_N signal. In this manner, each regulator voltage reference circuit 14A, 14B, 14C (FIG. 1) may be separately disabled and enabled as desired or required.

FIG. 3 depict a deleterious effect of the power management system of FIGS. 1 and 2. As a representative regulator voltage reference circuit 14N is enabled, and its switch 20 rendered conductive, the sudden load induces a transient voltage drop and current spike on the main reference voltage signal. This, in turn, induces a transient voltage drop on the regulator reference voltage signals output by all other currently-enabled regulator voltage reference circuits. Such noise on the power supply lines can have deleterious effects on the associated voltage regulators, and subsequently on the circuits supplied by the voltage regulators. For example, power supply glitches can randomly cause some—but not all—digital storage devices to change state, which may have disastrous consequences as processors, state machines, status registers, and the like are clocked into unknown and unintended states.

Prior art approaches to mitigating the deleterious effects of switching noise in enabling regulator voltage reference circuits include the use of RC-filters. However, resistors and capacitors can consume significant area on an integrated circuit. Additionally, in many cases the switching noise is transferred to the ground plane of the RC capacitor, which may disturb sensitive circuits sharing the same ground.

The Background section of this document is provided to place embodiments of the present invention in technological and operational context, to assist those of skill in the art in understanding their scope and utility. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to one or more embodiments described and claimed herein, a power management circuit generates a main reference voltage and distributes it to a plurality of independently-enabled regulator voltage reference circuits, each of which generates a predetermined reference voltage output for use by a voltage regulator. Separate enable signals and enable pre-charge signals are distributed to each regulator voltage reference circuit. As a regulator voltage reference circuit is enabled via its associated enable signal, an enable pre-charge signal is also asserted for an initial duration. Each regulator voltage reference circuit includes a voltage setting circuit, such as a resistive divider network, and a first current limiting transistor in series and operative to interrupt current to the voltage setting circuit when the regulator voltage reference circuit is disabled. A second current limiting transistor is selectively configured as a current mirror with the first current limiting transistor, and a pre-charge bias current from a current source passes through the second transistor. This limits the current through the first transistor and into the voltage setting circuit to prevent a large peak current, which occurs in prior art regulator voltage reference circuits to charge parasitic capacitances before the current settles to a designed operating level. The current limiting effectively decreases the slew rate of the voltage output signal, and minimizes the instantaneous current draw from the voltage reference input. Due to the pre-charge, the regulator voltage reference circuit being enabled introduces minimal noise on other, currently-enabled regulator voltage reference circuits receiving the same reference voltage. At the end of the initial duration (defined by the enable pre-charge signal), the current source and second transistor are disabled, and the first current limiting transistor supplies a full operational current to the voltage setting circuit.

One embodiment relates to a power management circuit. The power management circuit includes a main reference voltage circuit operative to generate a main reference voltage, and a plurality of regulator voltage reference circuits. Each regulator voltage reference circuit receives the main reference voltage and an enable signal, and is operative to output a signal having a predetermined voltage in response to the enable signal. Each regulator voltage reference circuit includes a voltage setting circuit operative to generate the predetermined voltage from the reference voltage, and a first current limiting transistor in series with the voltage setting circuit. The first current limiting transistor is operative to interrupt current to the voltage setting circuit in response to the enable signal. Each regulator voltage reference circuit also includes a second current limiting transistor proportionate in size to the first current limiting transistor, and a switching network connecting the first and second current limiting transistors. A control circuit is operative to control the switching network to couple the first and second current limiting transistors as a current mirror configuration so as to limit current supplied to the voltage setting circuit for an initial duration when the regulator voltage reference circuit is enabled. The control circuit is further operative to enable the first current limiting transistor and disable the second current limiting transistor after the initial duration.

Another embodiment relates to a method of selectively enabling a regulator voltage reference circuit comprising a voltage setting circuit operative to generate a predetermined voltage from a provided main reference voltage. The regulator voltage reference circuit is disabled by interrupting current to the voltage setting circuit. For an initial duration upon enabling the regulator voltage reference circuit, current to the voltage setting circuit is limited to a predetermined value. Following the initial duration, a designed operating current is provided to the voltage setting circuit.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

It should be understood at the outset that although illustrative implementations of one or more embodiments of the present disclosure are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Figure 4:
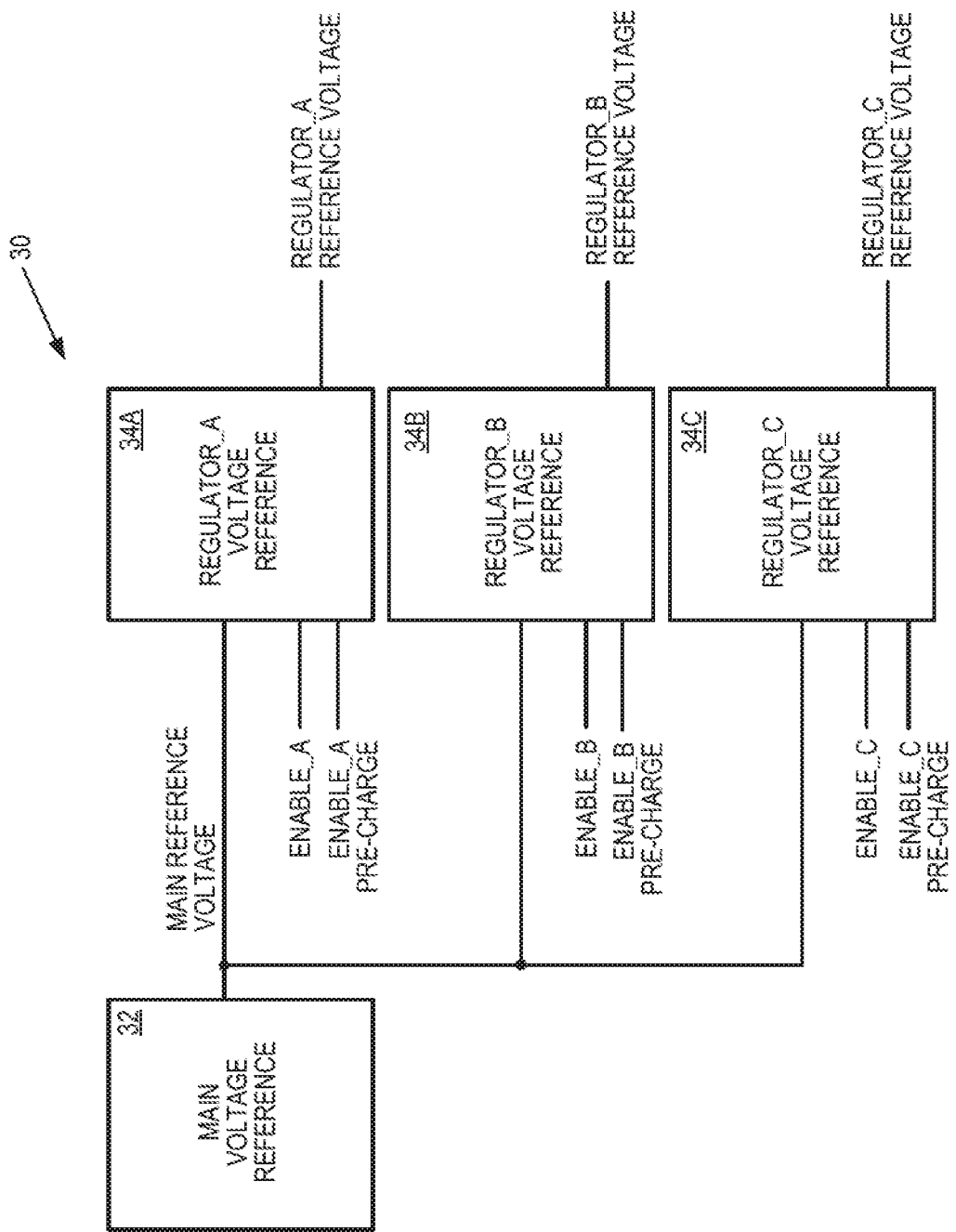
FIG. 4 is a functional block diagram of a power management system according to one embodiment of the present invention.

FIG. 4 depicts a power management circuit 30 according to one embodiment of the present invention. The power management circuit 30 includes a main voltage reference circuit 32 operative to generate and maintain a precise main reference voltage. The main reference voltage is distributed to a plurality of regulator voltage reference circuits 34A, 34B, 34C. Each of the regulator voltage reference circuits 34A-C outputs a predetermined regulator reference voltage, such as 12 VDC, 5 VDC, 3.3 VDC, or some other value. Each regulator voltage reference circuit 34A-C is independently enabled by a control circuit (not shown) via separate enable signals. Each regulator voltage reference circuit 34A-C also receives a separate enable pre-charge signal, which defines an initial duration, when the regulator voltage reference circuit 34A-C is enabled from a disabled state, during which the regulator reference voltage signal "ramps up" to its predetermined value, exhibiting an extended slew rate.

Figure 5:
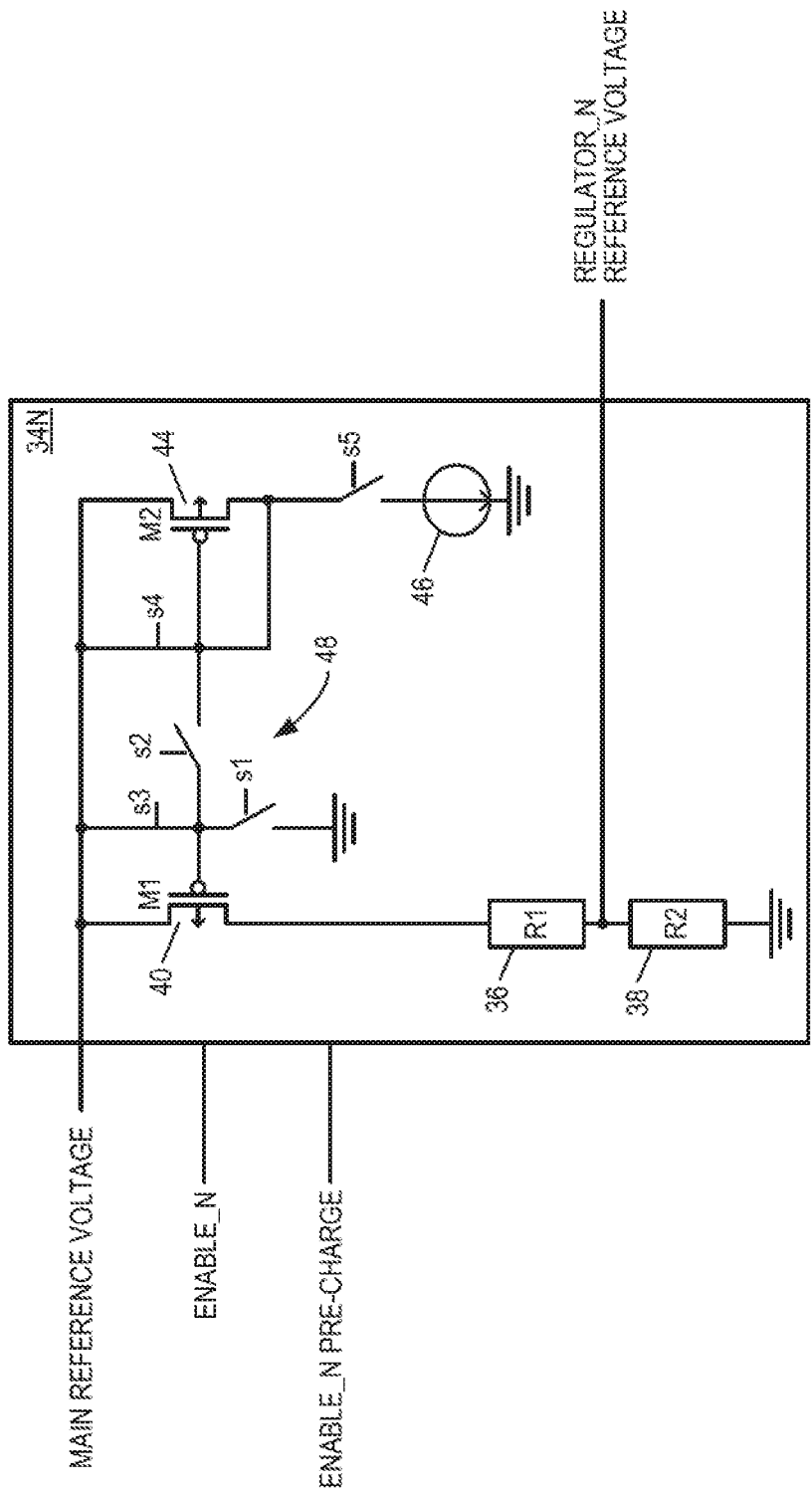
FIG. 5 is a functional block diagram of a regulator voltage reference circuit in the power management system of FIG. 4 in a disabled (inoperative) state.

FIG. 5 depicts a representative regulator voltage reference circuit 34N. The regulator voltage reference circuit 34N includes a voltage setting circuit, which may comprise a resistive voltage divider network formed by resistors 36, 38, operative to reduce the main reference voltage to a predetermined regulator reference voltage. A first current limiting transistor 40 (M1) is interposed in series with the voltage setting resistors 36, 38, and is operative to interrupt current to the voltage setting resistors 36, 38 when the regulator voltage reference circuit 34N is disabled via the enable_N signal. The first current limiting transistor 40 is controlled by a switching network 48, which changes state in response to the enable_N and enable_N pre-charge inputs. As depicted in FIG. 5, switch s3 is closed and switch s1 is open, connecting the gate of the first transistor 40 to the main reference voltage at its source, thus rendering the transistor 40 non-conductive. FIG. 5 thus depicts the regulator voltage reference circuit 34N in the disabled (inoperative) state.

Figure 6:
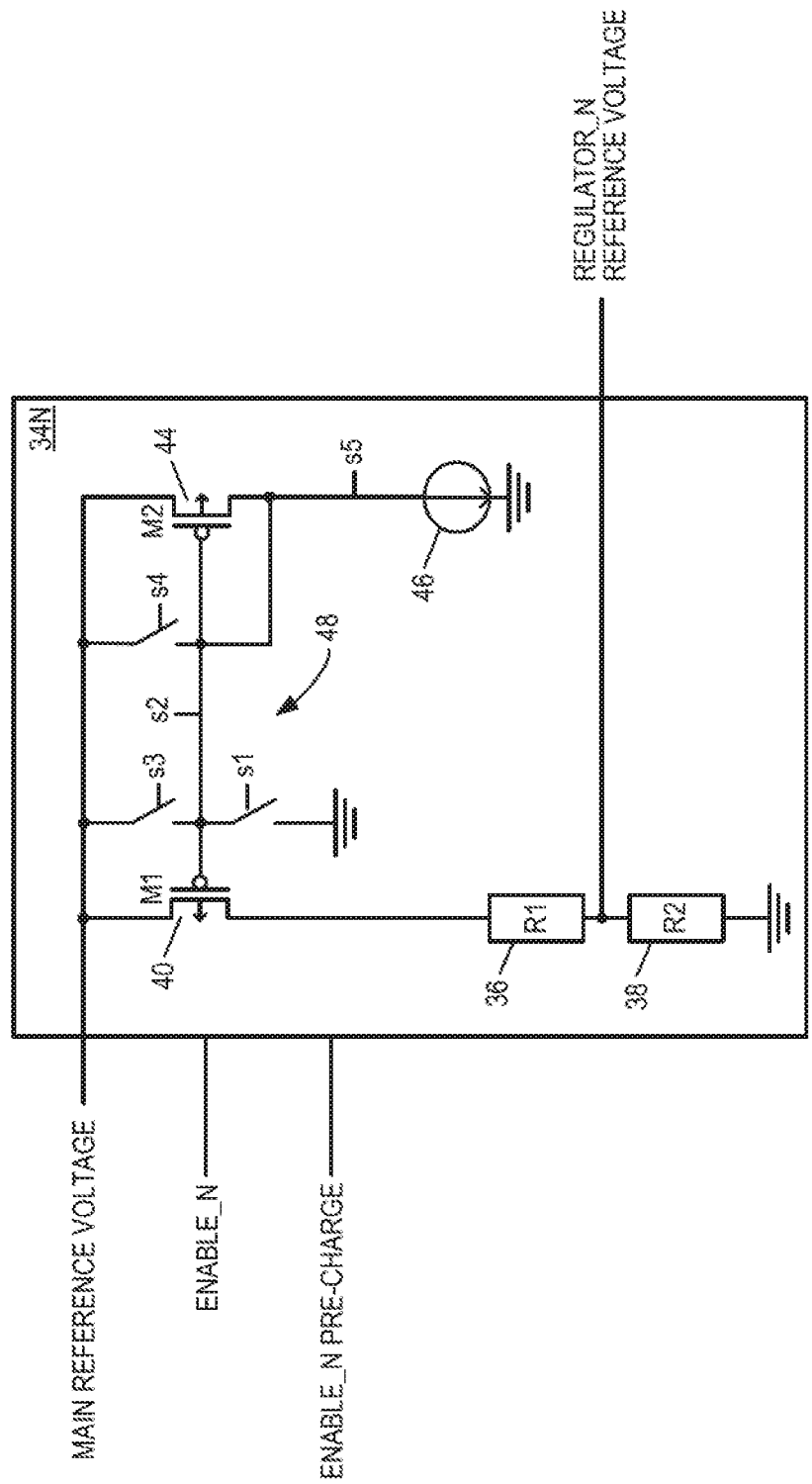
FIG. 6 is a functional block diagram of the regulator voltage reference circuit of FIG. 5 in a pre-charge (initialization) state.

Embodiments of the present invention reduce the transient effects introduced onto the main reference voltage signal, and hence on the regulator reference voltage outputs of other regulator voltage reference circuits receiving it, when the regulator voltage reference circuit 34N is enabled from a disabled state. To achieve this, the current supplied to the voltage setting resistors 36, 38 through the first current limiting transistor 40 is limited for an initial duration. This allows the load side of the transistor 40 to charge smoothly. To achieve this current limiting, the regulator voltage reference circuit 34N also includes a second current limiting transistor 44 (M2), which can be configured in a current mirror relationship with the first current limiting transistor 40, as depicted in FIG. 6. In this configuration of the switching network 48, switch s2 is closed, and s1, s3, and s4 are open; thus, the source and gate nodes of the two transistors 40, 44 are connected together (and the second transistor 44 is configured as a diode by connecting its gate and drain nodes).

The second transistor is paired on silicon with the first transistor 40, and the transistors 40, 44 are proportionate in size. For example, the transistors 40, 44 may have the same gate length; however, the gate width $W_{M1}$ of the first transistor 40 may be a large multiple of the gate width $W_{M2}$ of the second transistor 44. In the current mirror configuration, the drain current $I_{M1}$ of the first transistor 40 is proportional to the drain current $I_{M2}$ of the second transistor 44, according to:

$$I_{M1} = \frac{W_{M1}}{W_{M2}} I_{M2} \qquad (1)$$

A current source 46, connected to the second transistor 44 by switch s5, generates a predetermined pre-charge bias current when enabled by the enable_N pre-charge input signal. This is also the drain current $I_{M2}$ of the second transistor 44. The enable_N pre-charge signal is asserted for an initial duration when the regulator voltage reference circuit 34 is enabled from a disabled state. By the current mirror configuration, this limits the drain current $I_{M1}$ of the first transistor 40 to the value given by equation (1), which depends on the ratio of gate widths of the transistors 40, 44. The limited current $I_{M1}$ of the first transistor 40 avoids the large transient current that would otherwise occur as parasitic capacitances are charged when the first transistor 40 is first enabled. The reduced current $I_{M1}$ is selected to allow the regulator reference voltage of the regulator voltage reference circuit 34N to ramp smoothly up to its predetermined level, in reliance on the intrinsic capacitance between the first transistor 40 and the voltage setting resistors 36, 38, while minimally loading the main reference voltage input signal. In other embodiments, an external capacitor may yield better filtering and noise performance, but would impose additional cost and area constraints. Such considerations are well within the discretion of those of ordinary skill in the art, given the teachings of the present disclosure.

Figure 7:
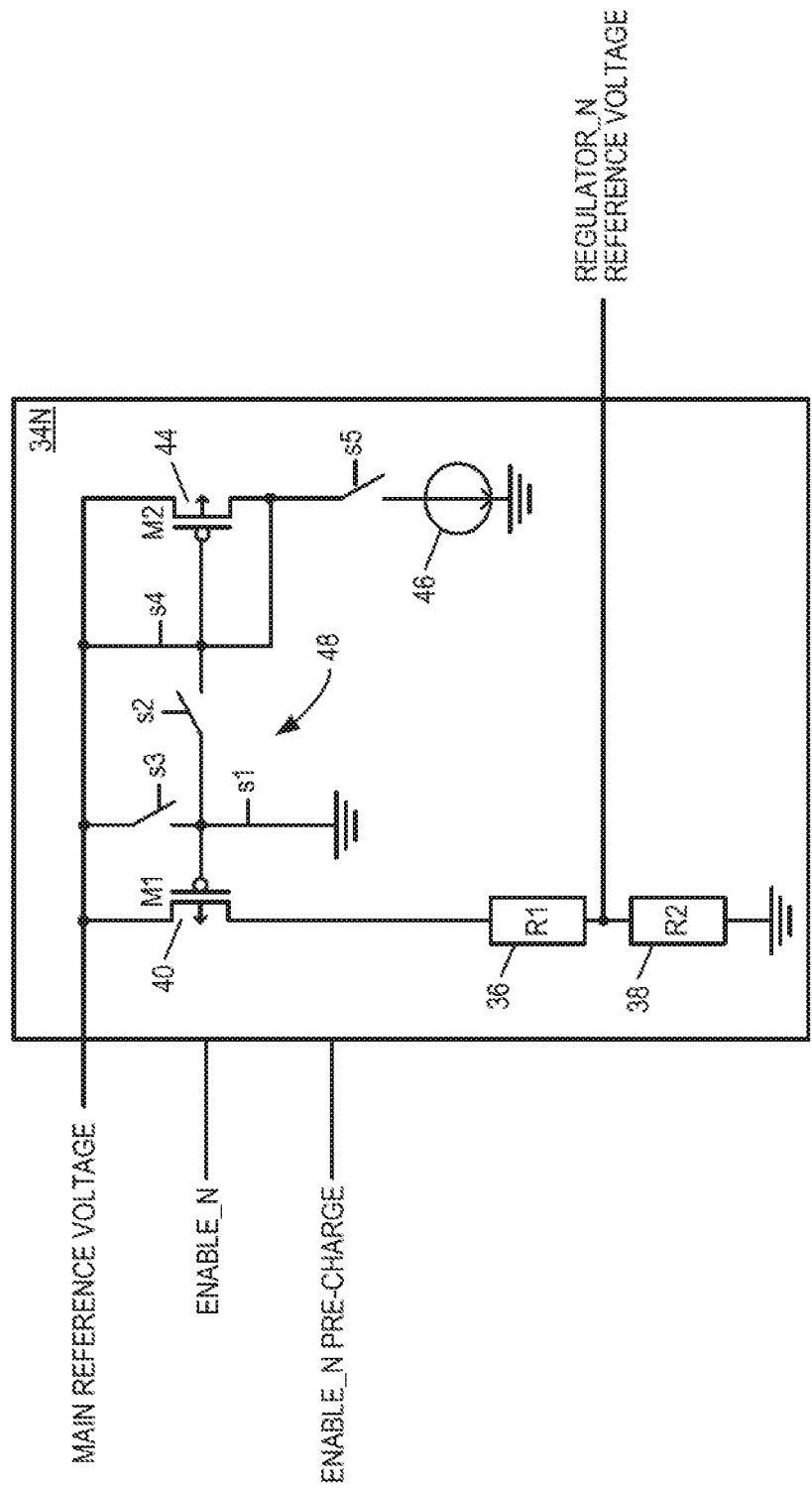
FIG. 7 is a functional block diagram of the regulator voltage reference circuit of FIG. 5 in an enabled (operative) state.

After an initial duration, when the regulator voltage reference circuit 34N output voltage has ramped up to its predetermined value, the enable_N pre-charge signal is deasserted (while the enable_N signal remains asserted), placing the regulator voltage reference circuit 34N in a fully enabled state, as depicted in FIG. 7. In this configuration, the first current limiting transistor 40 is fully ON, or in a conductive state, by grounding its gate node through switch s1, and disconnecting the gate from the main reference voltage by switch s3 being open. The designed operating current thus flows to the voltage setting resistors 36, 38. The second current limiting transistor 44 is disconnected from the first transistor 40 by switch s2, and is rendered OFF, or nonconductive, by pulling its gate node to the main reference voltage via switch s4. Switch s5 is open to disable the current source 46. This configuration of the switching network 48 effectively removes the second current limiting transistor 44 and current source 46, leaving the first transistor 40 acting as a switch, and the voltage setting resistors 36, 38 generating the predetermined regulator reference voltage. Note that, as in prior art designs, the regulator voltage reference circuit 34N may be transitioned from the enabled to the disabled state instantaneously, by deasserting the enable_N signal, which toggles the states of switches s1 and s3, pulling the gate of the first transistor 40 to the main reference voltage and rendering the transistor 40 nonconductive (compare FIGS. 7 and 5). Hence, there is no delay in putting a supplied voltage regulator and the circuits it supplies to "sleep;" the pre-charge delay is only imposed upon "waking" it.

Figure 1:
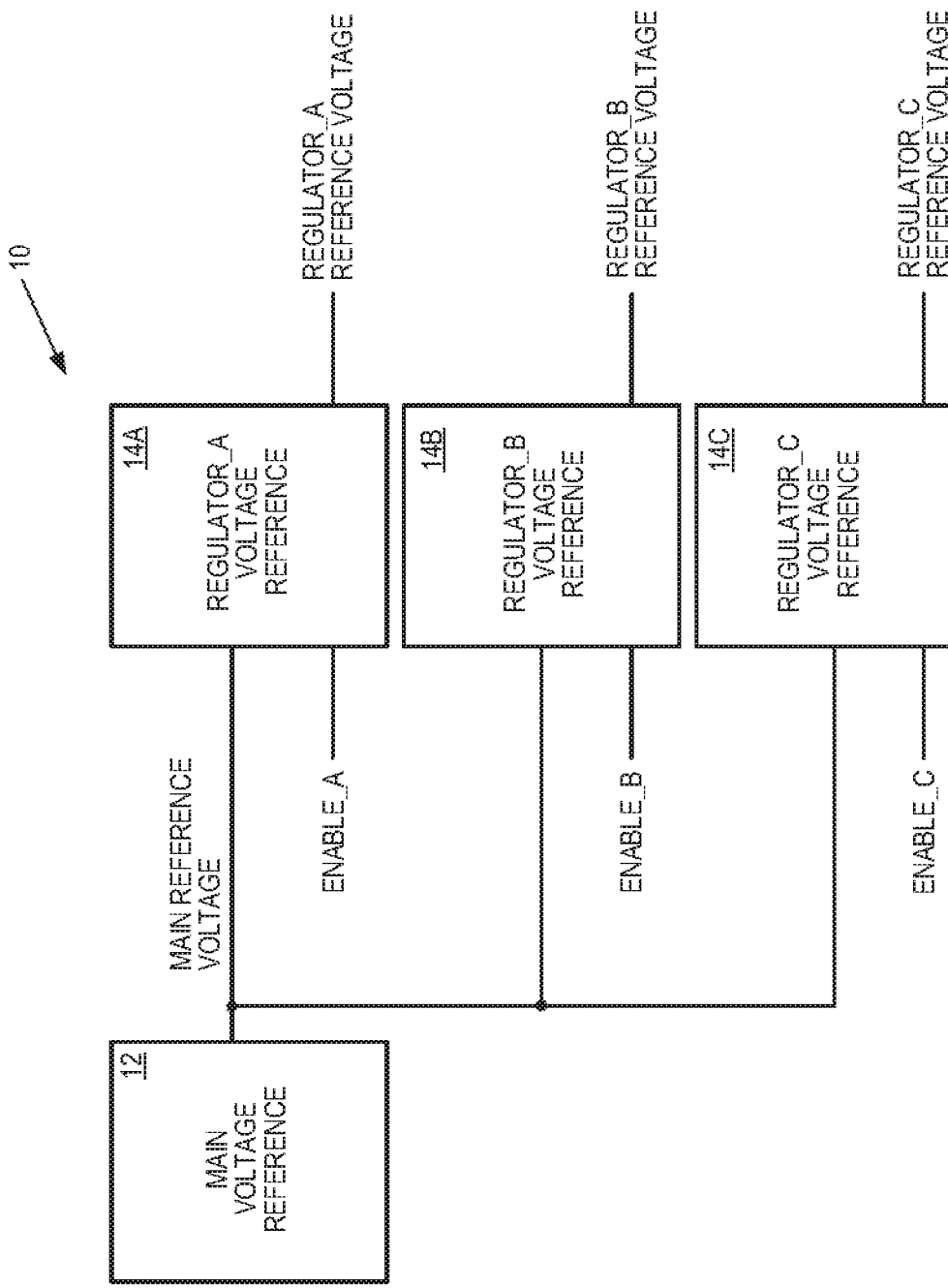
FIG. 1 is a functional block diagram of a prior art power management system.
Figure 2:
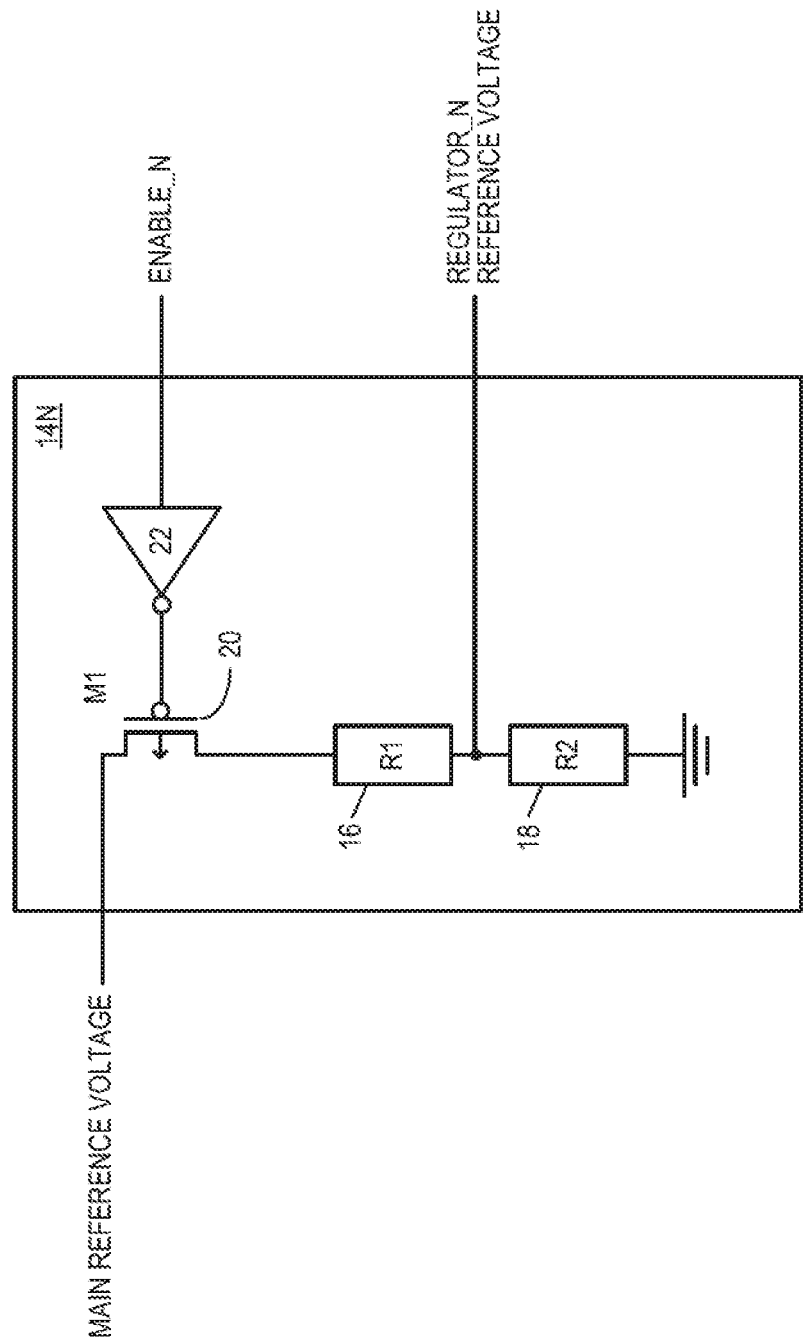
FIG. 2 is a functional block diagram of a regulator voltage reference circuit in the prior art power management system of FIG. 1.
Figure 3:
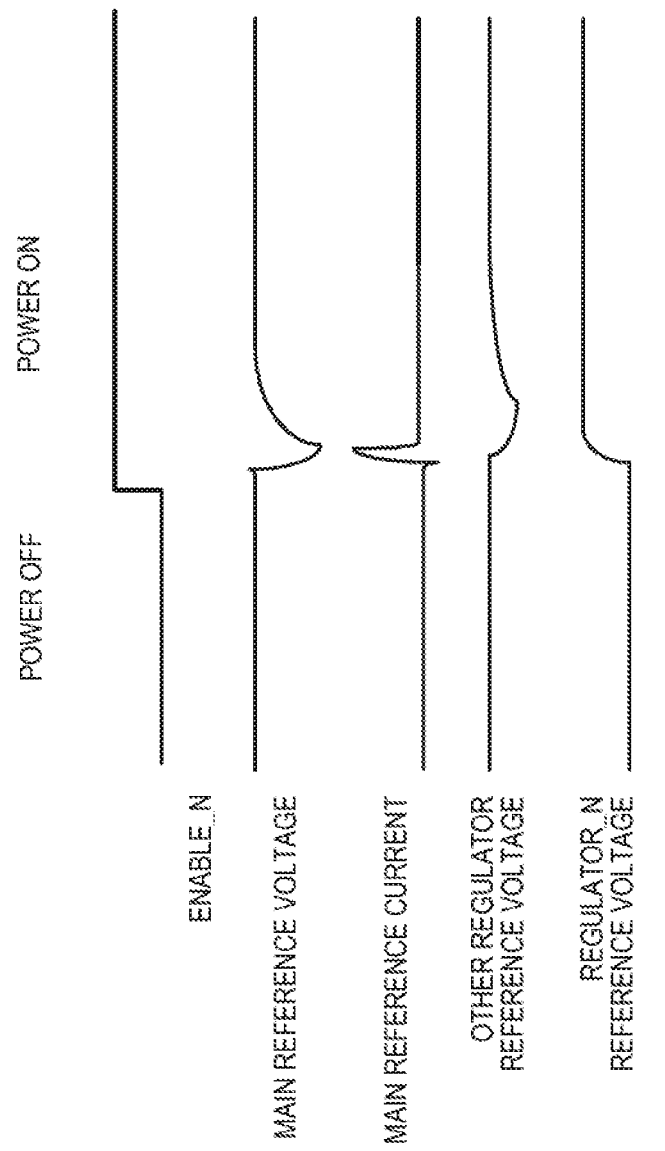
FIG. 3 is a signal diagram depicting noise induced by enabling the prior art regulator voltage reference circuit of FIG. 2.
Figure 8:
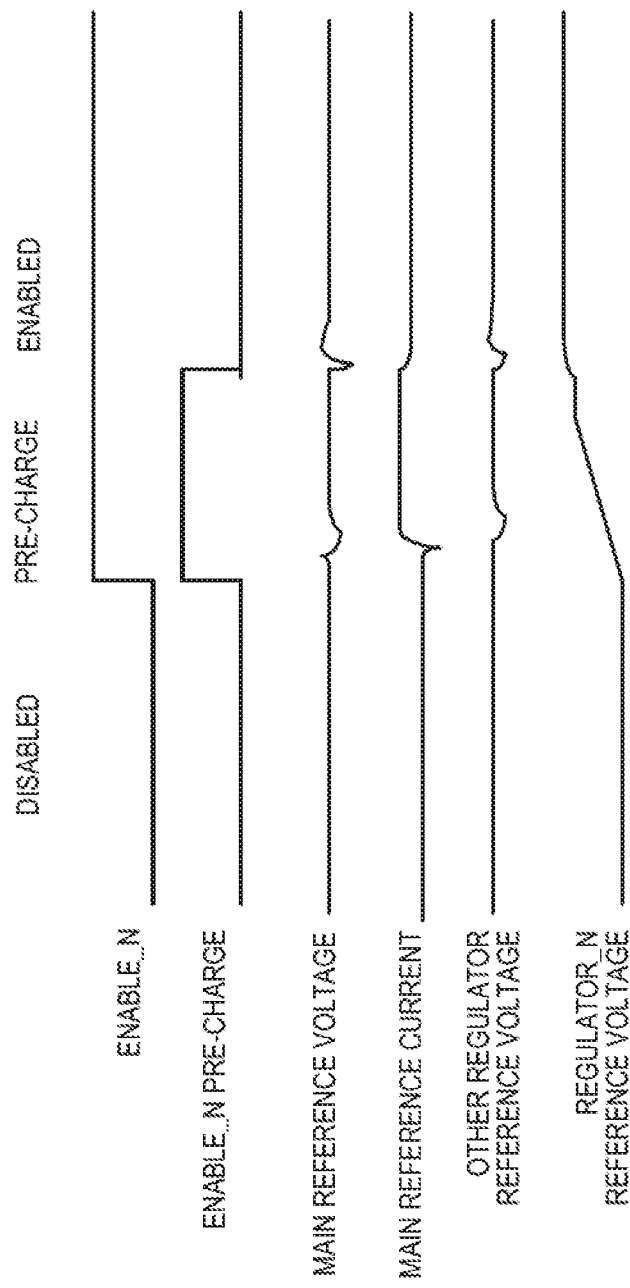
FIG. 8 is a signal diagram depicting the minimal noise induced by enabling the regulator voltage reference circuit of FIG. 5.

FIG. 8 depicts representative voltage and current graphs as a representative regulator voltage reference circuit 34N is transitioned from the disabled to enabled state via an intermediate pre-charge state, according to the present invention. Initially, both the enable_N and enable_N pre-charge signals are asserted together. This has some effect on the main reference voltage signal, which propagates through to the regulator reference voltages of other regulator voltage reference circuits 34 connected to the same main reference voltage signal. However, these transients are minor, as compared with the prior art (see FIG. 3). The output voltage of the regulator voltage reference circuit 34N being enabled exhibits a decreased slew rate, as it slowly ramps up from zero to its predetermined regulator reference voltage level. After an initial duration of current limiting, the enable_N pre-charge signal is deasserted, while the enable_N signal remains asserted, and the regulator voltage reference circuit 34N is in the enabled state.

Figure 9:
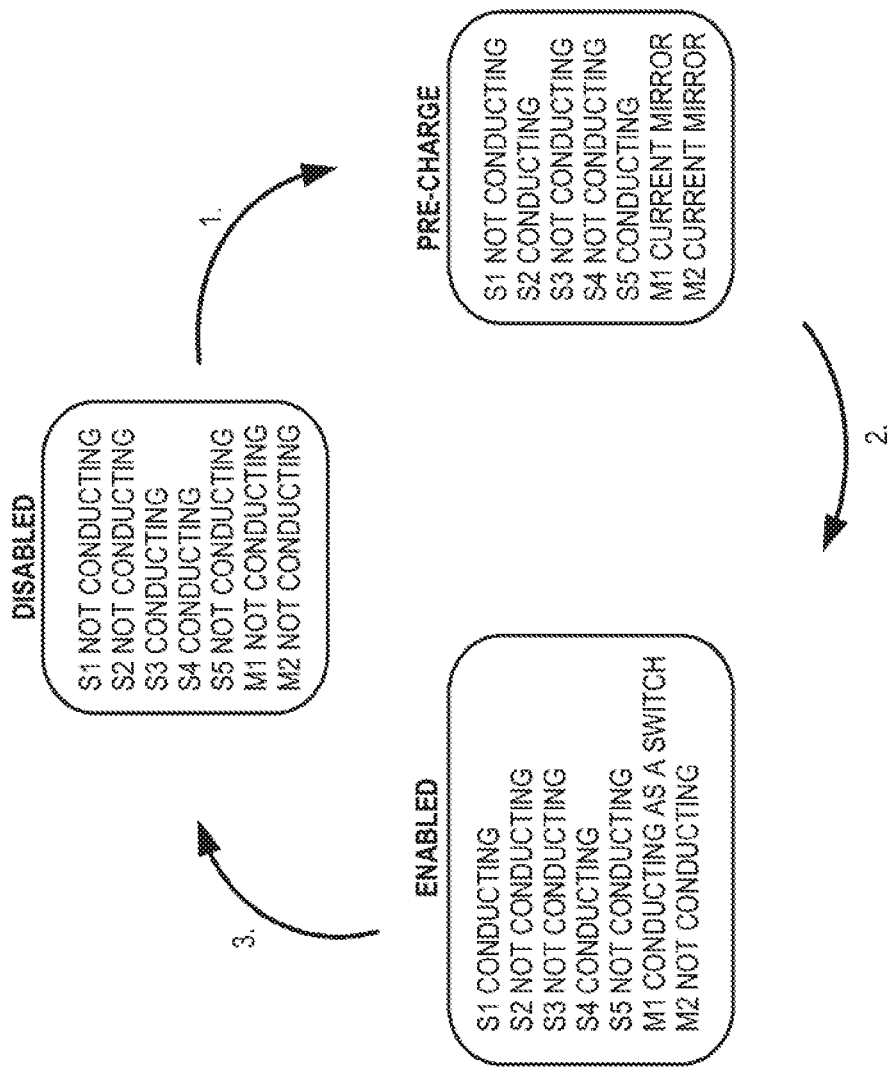
FIG. 9 is a state diagram depicting the transition of the regulator voltage reference circuit of FIG. 5 between disabled, pre-charge, and enabled states.

Table 1 below, as well as FIG. 9, depicts the states of the switches in the switching network 48 as the regulator voltage reference circuit 34N transitions between disabled, pre-charge, and enabled states. Of course, these tables reflect the particular configuration of switches in the switching network 48 as depicted in FIGS. 5-7. The present invention is not limited to this particular configuration, and other configurations of switches will be controlled differently to achieve the benefit of the present invention. The logic to drive the switching network 48—or other configuration of switches—from the states of the enable_N and enable_N pre-charge signals, is straightforward to those of skill in the art, and is not depicted in the drawing figures for clarity.

TABLE 1

Switch States

| Component | State | | |
|---|---|---|---|
| | Disabled (FIG. 5) | Pre-charge (FIG. 6) | Enabled (FIG. 7) |
| s1 | OFF | OFF | ON |
| s2 | OFF | ON | OFF |
| s3 | ON | OFF | OFF |
| s4 | ON | OFF | ON |
| s5 | OFF | ON | OFF |
| M1 | NON-CONDUCTIVE | CURRENT MIRROR | CONDUCTIVE |
| M2 | NON-CONDUCTIVE | CURRENT MIRROR | NON-CONDUCTIVE |

Figure 10:
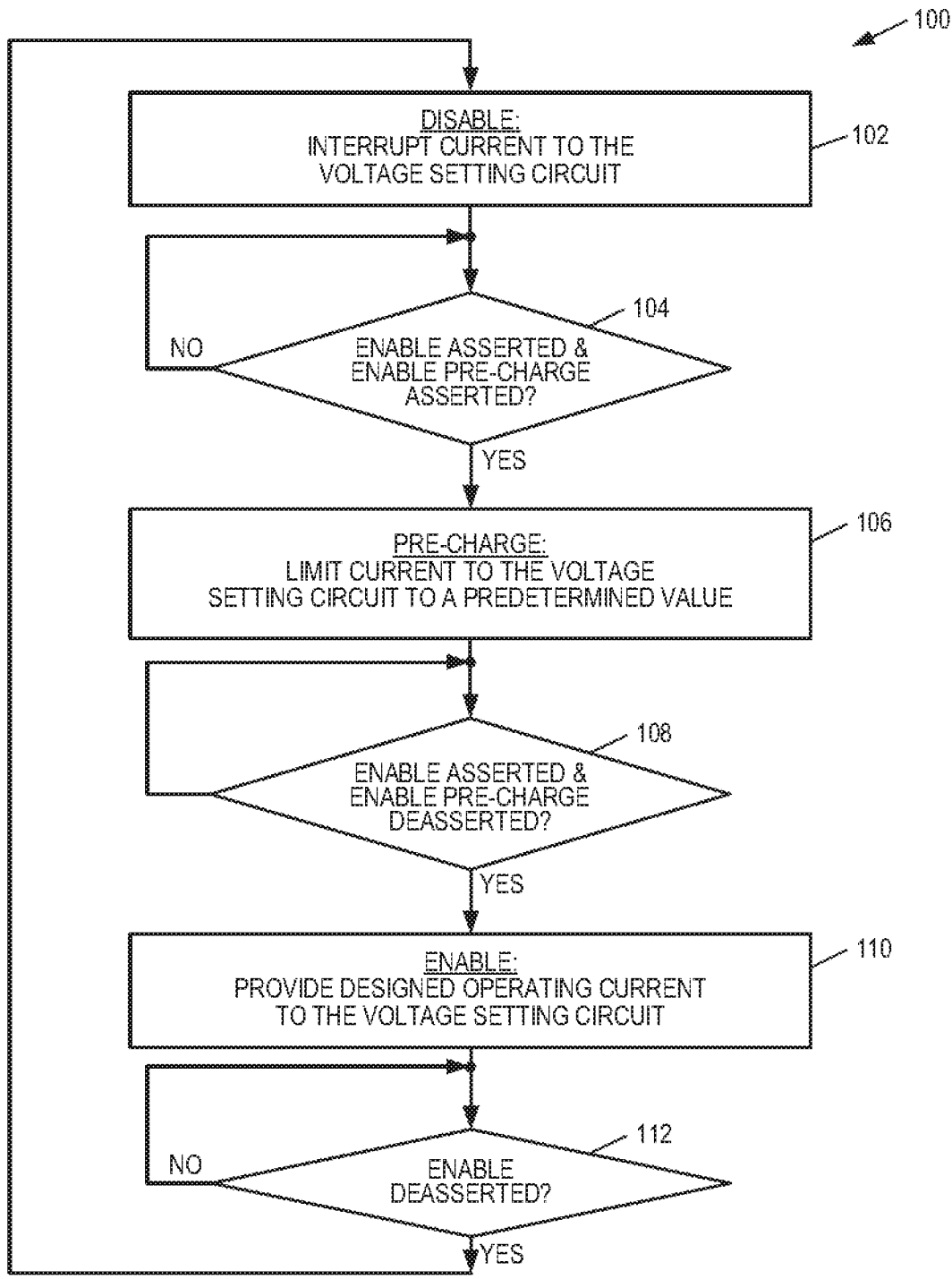
FIG. 10 is a flow diagram of a method of selectively enabling a regulator voltage reference circuit such as that of FIG. 5.

FIG. 10 depicts a method 100 of selectively enabling a regulator voltage reference circuit 34N of the type depicted in FIGS. 5-7. Initially, the regulator voltage reference circuit 34N is placed in a disabled state by interrupting current to its voltage setting resistors 36, 38 (block 102). If both the enable_N and enable_N pre-charge inputs are not asserted (block 104), the regulator voltage reference circuit 34N remains in the disabled state (block 102). If enable_N and enable_N pre-charge are both asserted (block 104), the regulator voltage reference circuit 34N enters a pre-charge state in which current to the voltage setting resistors 36, 38 is limited to prevent a large transient current spike (block 106). In one embodiment, this comprises placing a first current limiting transistor 40 in a current mirror configuration with a second current limiting transistor 44 and limiting the current through the second transistor 44. The predetermined, limited current provided to the voltage setting resistors 36, 38 will then be determined according to equation (1).

The regulator voltage reference circuit 34N remains in the pre-charge state as long as the enable_N and enable_N pre-charge inputs are asserted. When the enable_N input remains asserted but the enable_N pre-charge input is deasserted (block 108), the regulator voltage reference circuit 34N is placed in an enabled state by providing a designed operating current to the voltage setting resistors 36, 38 (block 110). In one embodiment, this occurs by disabling the current mirror, and rendering the first current limiting transistor 40 fully conductive. When the enable_N input is deasserted (block 112), the regulator voltage reference circuit 34N returns to the disabled state by interrupting current to the voltage setting resistors 36, 38 (block 102).

Those of skill in the art will recognize that variations in the method 100 are possible within the scope of the present invention. For example, in one embodiment, if the regulator voltage reference circuit 34N is disabled and only the enable_N input is asserted, it may go directly to the enabled state. This may be desired, for example, if the all regulator voltage reference circuits 34A-C are disabled, and this is the first regulator voltage reference circuit 34N being enabled. In that case, inducing transients on the main reference voltage line will not have adverse consequences, and the delay and power consumption of transitioning through the pre-charge state may be avoided. Additionally, the flow diagram of FIG. 10 depicts "normal" operation, to provide an enabling disclosure of embodiments of the present invention, and does not depict every possible transition. For example, from block 108, if both enable_N and enable_N pre-charge were deasserted, control logic may place the regulator voltage reference circuit 34N in a disabled state (block 102). Such unusual behavior is omitted from FIG. 10 for clarity, but full specification of all possible state transactions is well within the ability of those of skill in the art, given the teachings of the present disclosure.

Embodiments of the present invention present advantages over prior art power management circuits by avoiding deleterious transient effects induced in all regulator voltage reference outputs whenever one or more regulator voltage reference circuits 34A-C are enabled from a disabled state. In the embodiments depicted in FIGS. 5-7, the first current limiting transistor 40—present in prior art circuits to disable the regulator voltage reference circuit 34N—is reused for a current limiting function, in addition to its functionality as a nonconductive or fully conductive switch. Due to the current mirror configuration, the second current limiting transistor 44 may be relatively small, consuming little silicon area and dissipating little power. Similarly, the current source 46 need only generate a small current to limit the current provided to the voltage setting resistors 36, 38, further reducing power consumption.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

The invention claimed is:

1. A voltage reference circuit having a disabled state, an enabled state, and an intermediate state, wherein the voltage reference circuit is configured to receive a main reference voltage and operative to output a reference voltage in the enabled state, comprising:
   a voltage setting circuit operative to generate the reference voltage from the main reference voltage in the enabled state;
   a first transistor operative to interrupt current to the voltage setting circuit in the disabled state and to supply current to the voltage setting circuit in the enabled state and the intermediate state;
a second transistor;
a control circuit operative to enable the voltage reference circuit to switch to the enabled state via the intermediate state,
wherein, in the intermediate state, the first transistor and the second transistor are connected in a current mirror configuration; and
wherein, in the enabled state, the gate terminal of the second transistor is disconnected from the gate terminal of the first transistor, and the first transistor is set in a conductive state.

2. The voltage reference circuit of claim 1, further comprising a current source; and wherein, when the voltage reference circuit is in the intermediate state, a limited current supplied to the voltage setting circuit is proportional to a bias current generated by the current source.

3. The voltage reference circuit of claim 1, wherein the voltage setting circuit comprises a resistive voltage dividing network.

4. The voltage reference circuit of claim 1, wherein, when the voltage reference circuit is in the intermediate state, the current mirror configuration is operative to decrease a slew rate of the reference voltage output signal.

5. The voltage reference circuit of claim 1, wherein the size of the first transistor is a multiple of the size of the second transistor.

6. The voltage reference circuit of claim 5, wherein a gate width of the first transistor is a multiple of the size of a gate width of the second transistor.

7. The voltage reference circuit of claim 1, wherein the voltage reference circuit is included in an electronic device.

8. The voltage reference circuit of claim 7, wherein the electronic device is a wireless communications device.

9. The voltage reference circuit of claim 1, wherein the voltage-reference circuit is included in a power management circuit.

10. A power management circuit comprising:
a main reference voltage circuit operative to generate a main reference voltage;
one or more voltage reference circuits, each having a disabled state, an enabled state, and an intermediate state, and each configured to receive the main reference voltage and operative to output a reference voltage in the enabled state;
wherein the one or more voltage reference circuits each comprises:
a voltage setting circuit operative to generate the reference voltage from the main reference voltage in the enabled state;
a first transistor operative to interrupt current to the voltage setting circuit in the disabled state and to supply current to the voltage setting circuit in the enabled state and the intermediate state;
a second transistor;
a control circuit operative to enable the voltage reference circuit to switch to the enabled state via the intermediate state,
wherein, in the intermediate state, the first transistor and the second transistor are connected in a current mirror configuration; and
wherein, in the enabled state, the gate terminal of the second transistor is disconnected from the gate terminal of the first transistor, and the first transistor is set in a conductive state.

11. The power management circuit of claim 10, wherein the one or more voltage reference circuits each comprises a current source; and wherein, when the voltage reference circuit is in the intermediate state, a limited current supplied to the voltage setting circuit is proportional to a bias current generated by the current source.

12. The power management circuit of claim 10, wherein the voltage setting circuit comprises a resistive voltage dividing network.

13. The power management circuit of claim 10, wherein, when the voltage reference circuit is in the intermediate state, the current mirror configuration is operative to decrease a slew rate of the reference voltage output signal.

14. The power management circuit of claim 10, wherein the size of the first transistor is a multiple of the size of the second transistor.

15. The power management circuit of claim 14, wherein a gate width of the first transistor is a multiple of the size of a gate width of the second transistor.

16. The power management circuit of claim 10, wherein the power management circuit is included in an electronic device.

17. The power management circuit of claim 16, wherein the electronic device is a wireless communications device.

18. An electronic device comprising a power management circuit, the power management circuit comprising:
a main reference voltage circuit operative to generate a main reference voltage;
one or more voltage reference circuits, each having a disabled state, an enabled state, and an intermediate state, and each configured to receive the main reference voltage and operative to output a reference voltage in the enabled state;
wherein the one or more voltage reference circuits each comprises:
a voltage setting circuit operative to generate the reference voltage from the main reference voltage in the enabled state;
a first transistor operative to interrupt current to the voltage setting circuit in the disabled state and to supply current to the voltage setting circuit in the enabled state and the intermediate state;
a second transistor;
a control circuit operative to enable the voltage reference circuit to switch to the enabled state via the intermediate state,
wherein, in the intermediate state, the first transistor and the second transistor are connected in a current mirror configuration; and
wherein, in the enabled state, the gate terminal of the second transistor is disconnected from the gate terminal of the first transistor, and the first transistor is set in a conductive state.

19. The electronic device of claim 18, wherein the electronic device is a wireless communications device.

20. An electronic device comprising a voltage reference circuit having a disabled state, an enabled state, and an intermediate state, wherein the voltage reference circuit is configured to receive a main reference voltage and operative to output a reference voltage in the enabled state, the voltage reference circuit comprising:
a voltage setting circuit operative to generate the reference voltage from the main reference voltage in the enabled state;
a first transistor operative to interrupt current to the voltage setting circuit in the disabled state and to supply current to the voltage setting circuit in the enabled state and the intermediate state;

a second transistor;

a control circuit operative to enable the voltage reference circuit to switch to the enabled state via the intermediate state, wherein, in the intermediate state, the first transistor and the second transistor are connected in a current mirror configuration; and wherein, in the enabled state, the gate terminal of the second transistor is disconnected from the gate terminal of the first transistor, and the first transistor is set in a conductive state.

21. The electronic device of claim 20, wherein the electronic device is a wireless communications device.

* * * * *